United States Patent [19]

Rubey

[11] 3,825,999

[45] July 30, 1974

[54] METHOD OF CONNECTING ELECTRICAL COMPONENT

[75] Inventor: Ulyss Ray Rubey, Lewisville, Tex.

[73] Assignee: United Wiring and Manufacturing Co., Inc., Garland, Tex.

[22] Filed: Dec. 26, 1972

[21] Appl. No.: 318,589

[52] U.S. Cl. .................... 29/626, 29/401, 174/68.5, 174/72 A, 317/101 CC, 339/17 C

[51] Int. Cl. ............................................ H05k 3/32

[58] Field of Search ......................... 174/68.5, 72 A; 317/101 CC, 101 D, 101 A, 101 C; 29/625, 626, 628, 401; 339/17 CF, 275 B

[56] References Cited

UNITED STATES PATENTS

| | | | |
|---|---|---|---|
| 3,626,086 | 12/1971 | Rubey | 174/68.5 |
| 3,644,792 | 2/1972 | Fields | 174/68.5 X |
| 3,691,429 | 9/1972 | Glaser | 174/68.5 X |

*Primary Examiner*—Darrell L. Clay
*Attorney, Agent, or Firm*—Richards, Harris & Medlock

[57] ABSTRACT

A circuit board employs solder pads plated onto the reverse side of an insulative board in an orthogonal array and connected to aligned conductive areas on the obverse side by plated-through holes. Wire guides including upstanding fingers mount on the reverse side of the board with conductive pins from electrical components extending through the holes in the board from the obverse side to the reverse side.

Insulated wire is threaded around the pins of the electrical components and guide in accordance with a predetermined pattern of component interconnections. For interconnections between points on the board, wire is threaded substantially orthogonally. Where wire is to be severed, it is threaded angularly relative to the orthogonal array. After wire threading, the wire is selectively soldered to contact areas while evaporating locally the insulation thereon and component pins are soldered in plated-through holes. All angularly arrayed segments of the wire are cut and loose portions removed leaving only wire segments which form desired interconnections.

14 Claims, 8 Drawing Figures

PATENTED JUL 30 1974

3,825,999

SHEET 2 OF 4

METHOD OF CONNECTING ELECTRICAL COMPONENT

BACKGROUND AND SUMMARY OF THE INVENTION

This invention relates to automatic wiring of electrical circuit boards, and more particularly to a system for making selective electrical connections between conductive pins of circuit components.

Heretofore various techniques have been proposed for making circuit connections in electrical circuits. In one widely-used technique for wiring printed circuit boards, circuit elements are mounted on insulative boards and connections are made by soldering leads of the elements to conductive paths plated onto the boards. Circuit paths may be formed on both sides of a board by interconnected plated-through holes in the board. The resulting assembly comprising the board, components mounted on the board and plated circuit connections between the electrical components is typically referred to as a "printed circuit."

Printed circuit techniques have disadvantages. The packaging density of circuit elements is relatively low, so that the number of printed circuit boards required for a given application is not minimized. This results in increased production time and requires large inventories. Perhaps more importantly, the cost of the engineering work involved in making the art work for a printed circuit is relatively high, as are the costs involved in revising the art work should it become necessary to change the printed circuit arrangement.

Another technique employs multi-layer circuit boards. An assembly of two or more printed circuit boards are stacked and circuit connections are then provided between the boards. The high engineering costs involved in preparing original art work for printed circuit boards and in subsequently changing the art work are componded when multiple boards are used. Further, the yield that can be achieved in manufacturing such systems is low when complex electrical circuits are involved.

Still another approach involves a technique of wire wrapping. Conductive leads extend from circuit components into cantilever conductive sockets of square or rectangular cross-section. Electrical connections are then made to the sockets by spiral wrapping the end segments of individual wires very tightly around the sockets to assure contact at the corners of the socket. This technique requires an inventory of sockets for the electrical components. Where insulated wire is used, it is necessary to prestrip the ends of each wire. These two characteristics of the wire wrapping technique result in a very high unit cost per electrical connection.

In an effort to reduce costs and avoid other disadvantages encountered in the foregoing, electrical components have been attached to conductive areas on a circuit board in accordance with the method described in U.S. Pat. No. 3,626,086 wherein rows of solder pads are plated onto one side of a board. Metal strips with protruding fingers on opposite sides of the strip are positioned between rows of solder pads.

Insulated wire is then strung between solder pads soldering one end of the wire to a pad, passing the wire around and between the fingers and thence to another pad where it is soldered. After all of the connections necessary for a particular assembly have been thus formed, conducting leads of the circuit components are soldered to the pads to complete the assembly.

The present invention relates to a method of and apparatus for forming electrical connections to circuit components comprising an improvement over the technique of U.S. Pat. No. 3,626,086. Aligned conductive areas are plated onto the opposite sides of an insulative board. Holes are formed through the board with plating extending through each hole to interconnect the aligned conductive areas on the opposite sides of the board. Guide strips having central upstanding fingers with opposed downwardly inclined surfaces are mounted on one side of the board. Component leads are inserted into the holes in the board from the side opposite the guide strips. Insulated wire is then passed around the conductive leads and around the guide fingers along predetermined paths. The wires following orthogonal paths are then soldered to pads and wires following diagonal paths are severed to leave desired interconnections in place.

Defective electrical components are replaced by simply cutting its conductive leads and thereafter substituting a component by soldering the leads of the new component to the thermally isolated portions of solder pads on the opposite side of the board.

Combs comprising conductive teeth and a spine may be inserted in the holes in the circuit board instead of the leads of electrical components. Insulated wire may be threaded around the teeth in the manner previously described and ultimately soldered to pads. Thereafter the spine of the comb may be removed and a circuit component electrically connected by soldering leads thereof from the component to the thermally isolated pad on the opposite side of the board.

Further, the solder pads are arranged in an orthogonal array with the guides extending in one direction of the array. Wires which are to remain intact are strung along orthogonal directions, and wires which are to be severed extend angularly.

The guide maintains a predetermined spaced relationship between wires to be soldered to pads and wires which pass between adjacent guides.

DESCRIPTION OF THE DRAWINGS

A more complete understanding of the invention may be had by referring to the following detailed description when taken in conjunction with the accompanying drawings wherein.

DETAILED DESCRIPTION

Figure 1:
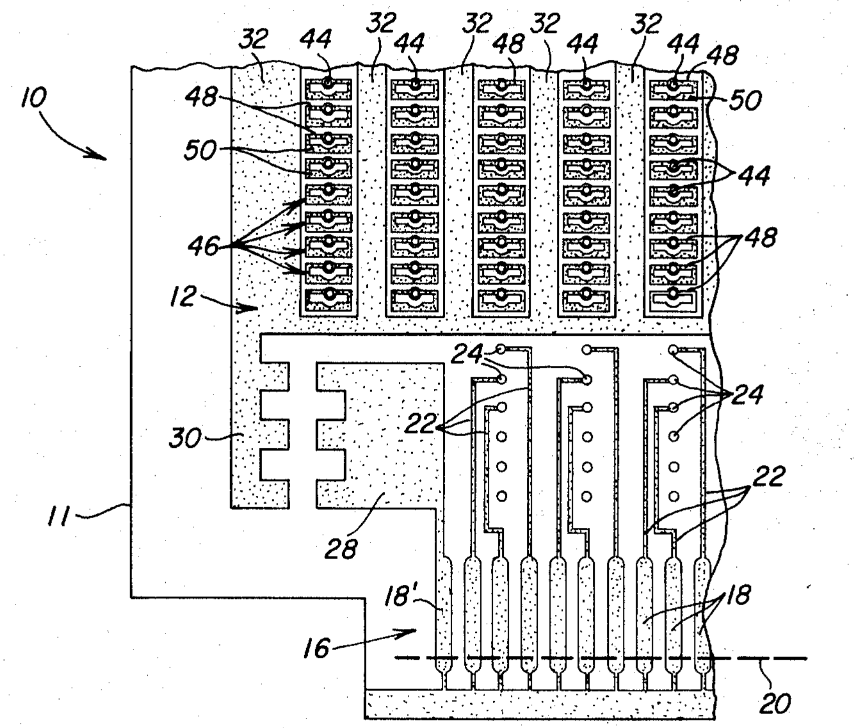
FIG. 1 is an enlargement of a portion of the obverse side of a printed circuit board.
Figure 2:
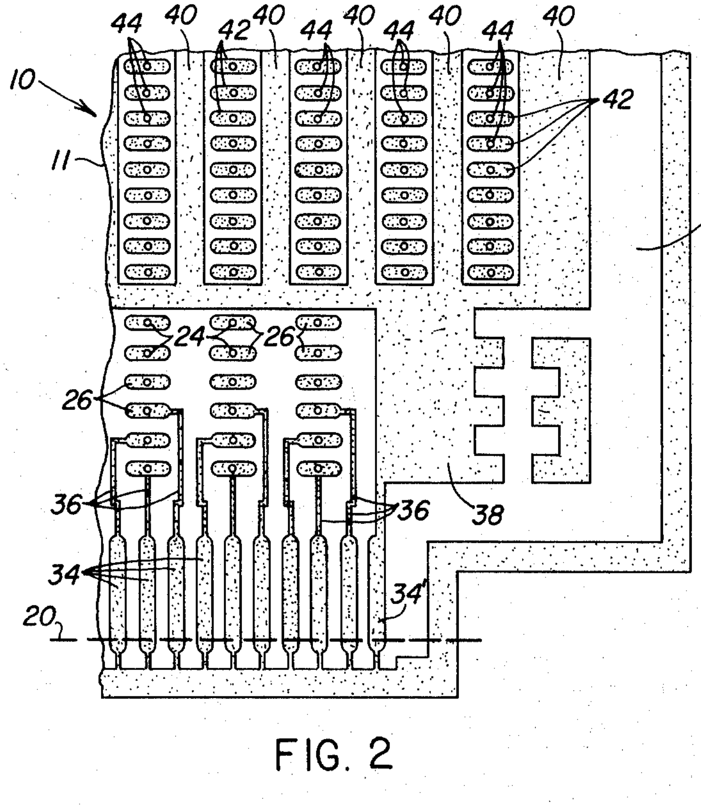
FIG. 2 is an enlargement of the corresponding portion of the reverse side of the printed circuit board.

Referring now to the drawings, two sides of the same corner of a printed circuit board 10 are shown in FIGS. 1 and 2, respectively. Only a small portion of the circuit board 10 is illustrated in FIGS. 1 and 2 with the scale greatly enlarged for clarity of illustration.

The structural component of the printed circuit board 10 comprises a board 11 formed from an electrically insulative material. The board 11 is normally fabricated from copper-clad fiber Epoxylaminate. The board 11 is preferably of the thickness of conventional 1/16 inch printed circuit boards. However, the thickness of the board 11 is not critical to the practice of the invention.

Board 10 includes an edge connector portion 16. On the obverse side 12 of the printed circuit board 10, the edge connector portion 16 comprises a plurality of plated conductive fingers 18 arranged in a parallel array along one edge of the printed circuit board. In FIG. 1 the ends of the fingers 18 are illustrated as being interconnected. Once formed, the edge of the printed circuit board 10 is cut away along the dashed line 20 so that the ends of the fingers 18 are separated.

Most of the conductive fingers 18 on the obverse side 12 of the printed circuit board 10 have conductors 22 which extend to holes 24. The holes 24 comprise plated-through holes, whereby the fingers 18 are electrically connected to conductive islands 26 formed on the reverse side 14.

The conductive finger 18' extends to a conductive bus area 28. One of the conductive fingers at the opposite edge of the array 18 (not shown) is connected to a bus area 30 including a plurality of parallel ribbons 32. The ribbons 32 are electrically common and are to be at a predetermined electrical potential.

Conductive fingers 34 of matching fingers 18 are formed on the edge connector portion 16 on the reverse side 14. Most of the conductive fingers 34 extend to conductive paths 36 which in turn extend to one of the conductive islands 26 individually surrounding the plated-through holes 24. Each of the plated-through holes 24 and the surrounding conductive island 26 is either electrically connected to one of the conductive fingers 18 (FIG. 1) or is electrically connected to one of the conductive fingers 34 (FIG. 2). Portion 16 is therefore adapted for use in conjunction with a conventional edge connector to direct input and control signals to the printed circuit board 10 and to convey output signals from the printed circuit board 10.

One conductive finger 34 (FIG. 2) is electrically connected to a bus area (not shown) similar to the bus area 28 (FIG. 1). The conductive finger 34' is connected to a bus area 38 which is electrically common to a plurality of parallel ribbons 40. Ribbons 40 are to be maintained at a predetermined electrical potential which is in practice different than the potential maintained on area 30, (FIG. 1).

A plurality of conductive islands 42 (FIG. 2) are pierced by a hole 44 extending through board 10. The holes 44 comprise plated-through holes and serve to electrically interconnect islands 42 (FIG. 2) to aligned conductive areas 46 (FIG. 1). Conductive areas 46 (FIG. 1) each comprise a narrow conductive ribbon 48 extending from hole 44 to a substantially wider conductive peninsula area 50. By this means the plating comprising each peninsula area 50 is thermally isolated both from the plating in hole 44 and the plating comprising the conductive island 42 (FIG. 2).

In FIG. 2, the conductive islands 42 are arranged in an orthogonal array. That is, islands 42 are arranged in rows and columns extending parallel to the sides of the printed circuit board 10. The columns of islands 42 are separated by ribbons 40. Areas 46 (FIG. 1) are arranged in an identical orthogonal array and are separated by ribbons 32.

Figure 3:
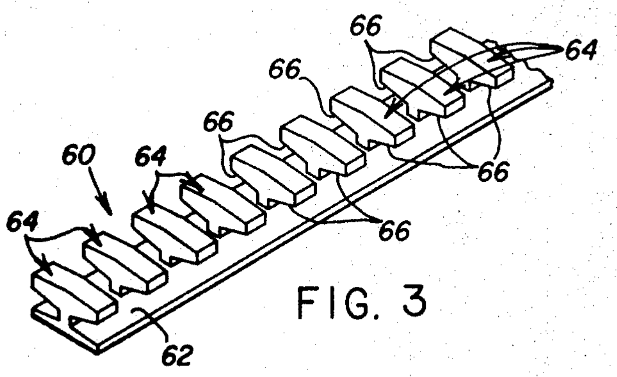
FIG. 3 is a perspective view of a wire guide member utilized in the practice of the invention.

FIG. 3 illustrates a wire guide 60 which is utilized in the practice of the invention. Guide 60 is a unitary structure formed entirely from an insulative material. Guide 60 includes a wide, flat base 62 which is adhesively secured to the reverse side 14. T-shaped pillars or finger guides 64 extend upwardly from base 62. Each guide 64 has opposed, outwardly facing, downwardly and inwardly inclined camming surfaces 66. Confronting faces of adjacent guides are parallel and planar. Guide 60 may be made from a plastic extrusion of cross section shown in FIG. 3. The stips are then transversely grooved forming lands and grooves of equal width and spacing corresponding with the spacing between holes 44 in board 10. With such cross section, wire wrapped around any guide 64 automatically is cammed downwardly toward the base 62.

Figure 4:
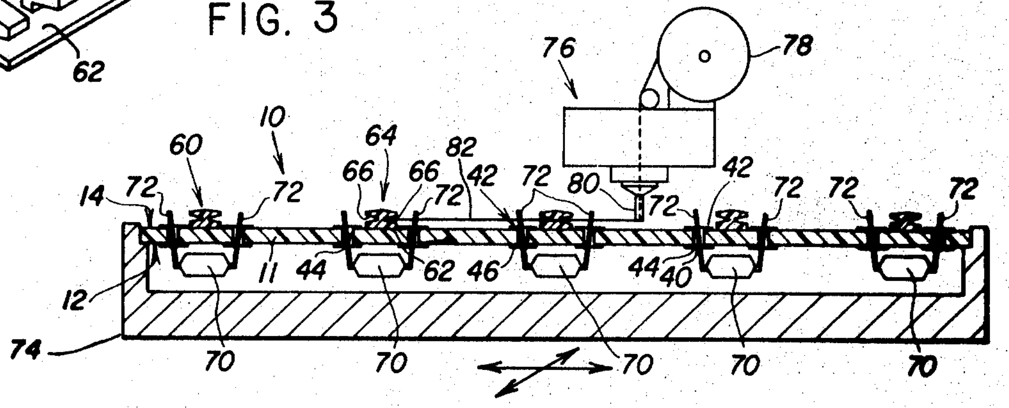
FIG. 4 is a sectional view of a board in a support for automatic wiring.
Figure 5:
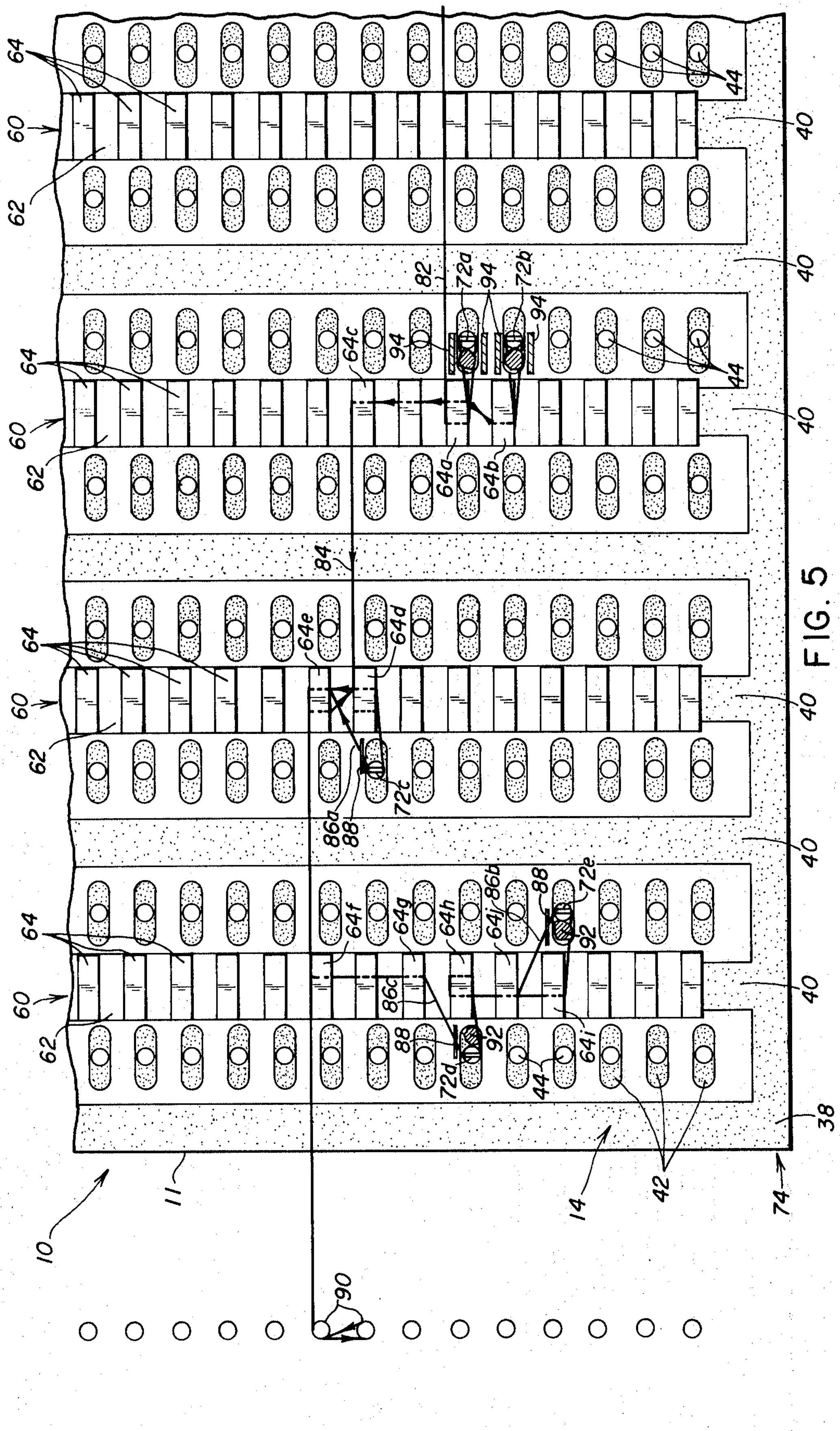
FIG. 5 is an illustration of certain other steps in the method.

A method of wiring electrical components incorporating the present invention and utilizing the printed circuit board 10 of FIGS. 1 and 2 to which guide 60 of FIG. 3 is applied is illustrated in FIGS. 4 and 5. As shown in FIG. 4, four guide strips 60 are secured to the reverse side 14 of board 10 by conventional means, such as by suitable adhesives. Guides 60 are mounted between rows of pads 42 as shown. The guides 60 are mounted on the surface of alternate ribbons 40 of the conductive bus area 38.

Component leads are then inserted through the holes 44 from the obverse side 12 to the reverse side 14 thereof. The components may comprise any of the various circuit elements which are commonly utilized in fabricating electronic devices. For example, they may be resistors, capacitors, inductors and other "passive" devices. They may also comprise diodes, transistors, SCR's, and various "active" electrical components. In the form illustrated, the circuit board 10 is designed to accommodate dual in-line integrated circuit packages of the type illustrated in FIGS. 4 and 6. Components of this type comprise a body 70 which may house various types of active and/or passive circuit elements, with two rows of conductive pins 72 extending from spaced points along the opposite sides of the body 70. They are mounted on board 10 with each pin 72 extending through one of holes 44. Thus the holes 44 preferably are located to correspond with the positioning of leads on components to be wired. It will be recognized that substantially the entire obverse side 12 of board 10 may be covered with circuit packages, or any lesser number of packages may be mounted on board 10 in accordance with the requirements of a particular application.

After components are mounted, board 10 is positioned on an *x-y* table 74 (FIG. 4) with the reverse side 14 thereof up and with the obverse side 12 down. A wire feed unit 76 is positioned above the *x-y* table and is provided with a supply of insulated wire 78. Unit 76 includes a wire capillary 80 for dispensing wire from the supply 78 at a level closely adjacent to side 14 of board 10.

Feed unit 80 and table 74 are operated such that relative movement between them preferably is preprogrammed to drive table 74 along paths such that a continuous wire will be strung to all desired locations on the board in one continuous operation. This operation is indicated in FIG. 4, where wire extends from the supply 78 through capillary 80. It is first connected to a fixed point. Thereafter the *x-y* table 74 moves under program control or manually to string wire 82 across the reverse side 14 of board 10.

As indicated in FIG. 5, wire 82 extends from the right margin and is wrapped around one guide 64*a*. Due to the camming surfaces 66 (FIG. 3) of guide 64, the wire is cammed downwardly toward board 10 during wrapping. This assures that previously installed wire will not obstruct the path of capillary 80 in subsequent wiring operations.

The programmed selection of guide 64*a* (FIG. 5) is determined by the necessity of connecting the wire to a particular point. After the wire 82 passes around guide 64*a*, it is wrapped around the adjacent conductive pin 72*a*. Thereafter the *x-y* table moves to wrap wire 80 again around guide 64*a*, and thence around guide 64*b*, pin 72*b*, back around guide 64*b*, around the right side of guide 64*a*, around guides 64*c*, 64*d*, 64*e* and around pin 72*c*. From pin 72*c* wire 82 passes diagonally in portion 86 to guide 64*e* and thence to and around edge posts 90. From post 90, wire 82 passes around guides 64*f*, 64*g*, pin 72, again around guide 64*h*, and thence around guide 64*i* and pin 72*e*. Then wire 82 passes diagonally to and around guide 64*j* and thereafter to any other guide-pin destination dictated by the interconnections to be made on board 10.

In laying the wire 82, the path thereof is substantially in accordance with the directions of the orthogonal array of solder pads 42 where a single length of wire interconnects two of the pins 72. Typically, a circuit does not comprise a single length of wire connected between various conductive pins. It is necessary to utilize many discrete lengths of wire in order to form all of the connections that are generally necessary.

Since wire 82 is installed as a single length to reach all points of connection, it is necessary to sever wire 82 at various points. As above indicated where a cut is to be made, wire 82 passes from a guide 64, passes preferably twice around pin 72, and then around a different guide 64, causing the wire to extend diagonally rather than orthogonally. Three such sections 86*a*, 86*b* and 86*c* are shown in FIG. 5.

After wire 82 has been installed in all desired locations, a knife holder (not shown) carrying knives 88 moves downward to drive knives 88 onto the areas between adjacent pads 42. Knives 88 engage only portions of wire which extend diagonally or angularly. By this means the wire is severed at all desired points. Alternatively, one of the knives 88 may be mounted in an *x-y* unit and moved under program control to locations where wire is to be severed.

Whenever the *x-y* table moves to string wire 82 angularly, this is followed by wrapping the wire 82 around a pair of fixed edge pins 90 on table 74 located adjacent board 10. By this means, the "tail" remaining after wire 82 is cut by knives 88 is secured to the pins 90 and is thereby automatically withdrawn when board 10 is removed from the *x-y* table.

As above noted, the relative movement between the wire feed unit 76 and table 74 may be carried out manually. Preferably the movements of the *x-y* table 74 are preprogrammed such as by means of a computer, a numerical control system, or the like. The orthogonal array of the component parts of the printed circuit board and the space between the component parts readily accommodate automatic control of the wiring operation. Production line operations involving many replications of the same board are carried out much more rapidly and accurately than could be done manually.

After knives 88 cut the angularly extending portions of the wire 82, board 10 is removed from the *x-y* table and is positioned on a second *x-y* table (not shown) where insulation removal and soldering operation takes place simultaneously. The insulation is of the type which vaporizes at soldering temperature.

Solder connections 92 are formed between wire 82, pads 42, plated-through holes 44 and pins 72*a–e* positioned therein. Contact heating, induction heating, laser beam, infra red or microwave heating, all well known, may be utilized individually or in combination to vaporize the insulation and to melt the solder either simultaneously or in two separate steps. The soldering operation may comprise a reflow process utilizing the plating comprising pads 42, or additional solder may be deposited on top of pads 42. In any event, soldering is one step in the wiring operation. Solder connections 92 adjacent to pins 72 projecting through holes 44 electrically interconnect selected pins 72 in accordance with the requirements of a particular wiring operation.

Where it is necessary to thread wire 82 between adjacent guides 60, the wire may pass adjacent to a pad 42 that is to be soldered. In such case, soldering is preferably carried out with the aid of shield members 94. Members 94 may actually displace wire 82, but in any event maintain predetermined spaced relationships to pads 42 and affords additional thermal isolation for the wire adjacent a solder location during the soldering operation.

Where all operations are to be carried out on the same *x-y* table, unit 76 (FIG. 4) may include wire threading apparatus, wire cutting apparatus and soldering apparatus. The cutting operation may be carried out during the threading operation. In such a case the wire is restarted downstream of each cut. This is preferably accomplished by programming unit 76 to wrap the wire two or more times around one of pins 72 followed by additional wire stringing.

Figure 6:
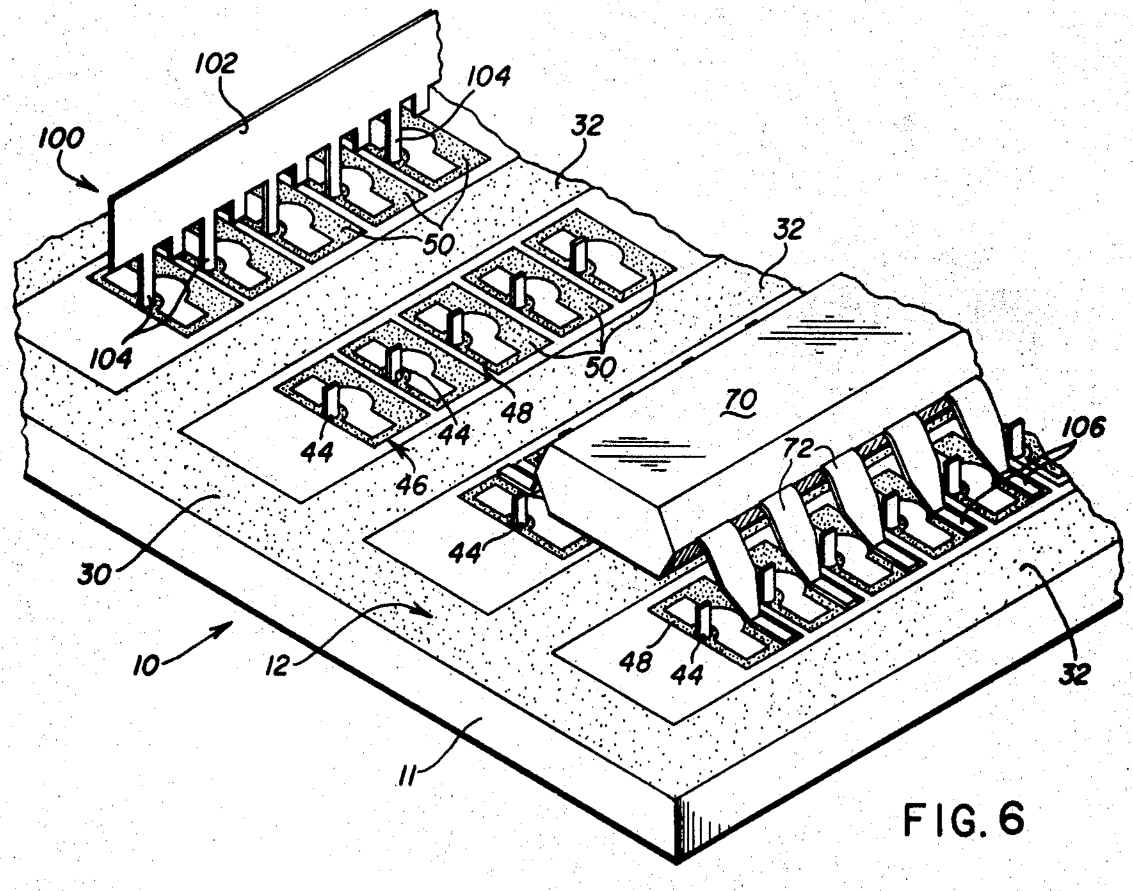
FIGS. 6, 7 and 8 are illustrations of various features of the invention.

In FIG. 6, there is shown a conductive comb 100 comprising a spine 102 and a plurality of conductive teeth 104 extending from the spine 102. Teeth 104 are positioned in accordance with the spacing of the holes 44 formed in board 10. Comb 100 is preferably made from beryllium copper or some other conductive material adapted for chemical milling or stamping.

In one use of comb 100, pins 104 extend through the holes 44 from the obverse side 12 to the reverse side 14 of board 10.

After pins 104 have been secured in holes 44, they may be utilized in a wiring in the same manner as pins 74 (FIG. 5). Following wiring and soldering operations, spine 102 is severed from the pins 104.

Dual in-line circuit packages can then be soldered to the obverse side 12 of the printed circuit board 10. This is accomplished by bending the extremities of pins 72 outwardly to form feet 106. The feet 106 are then soldered to peninsula areas 50 of pads 46 on the obverse side 12. Due to the thermal insulation between peninsula areas 50 and plating in holes 44, and due to insulation between peninsula areas 50 and the plating comprising pads 42 on the reverse side 14, the soldering operation does not result in unsoldering either pins 104 or wires previously soldered to pads 42.

Figures 7, 8:
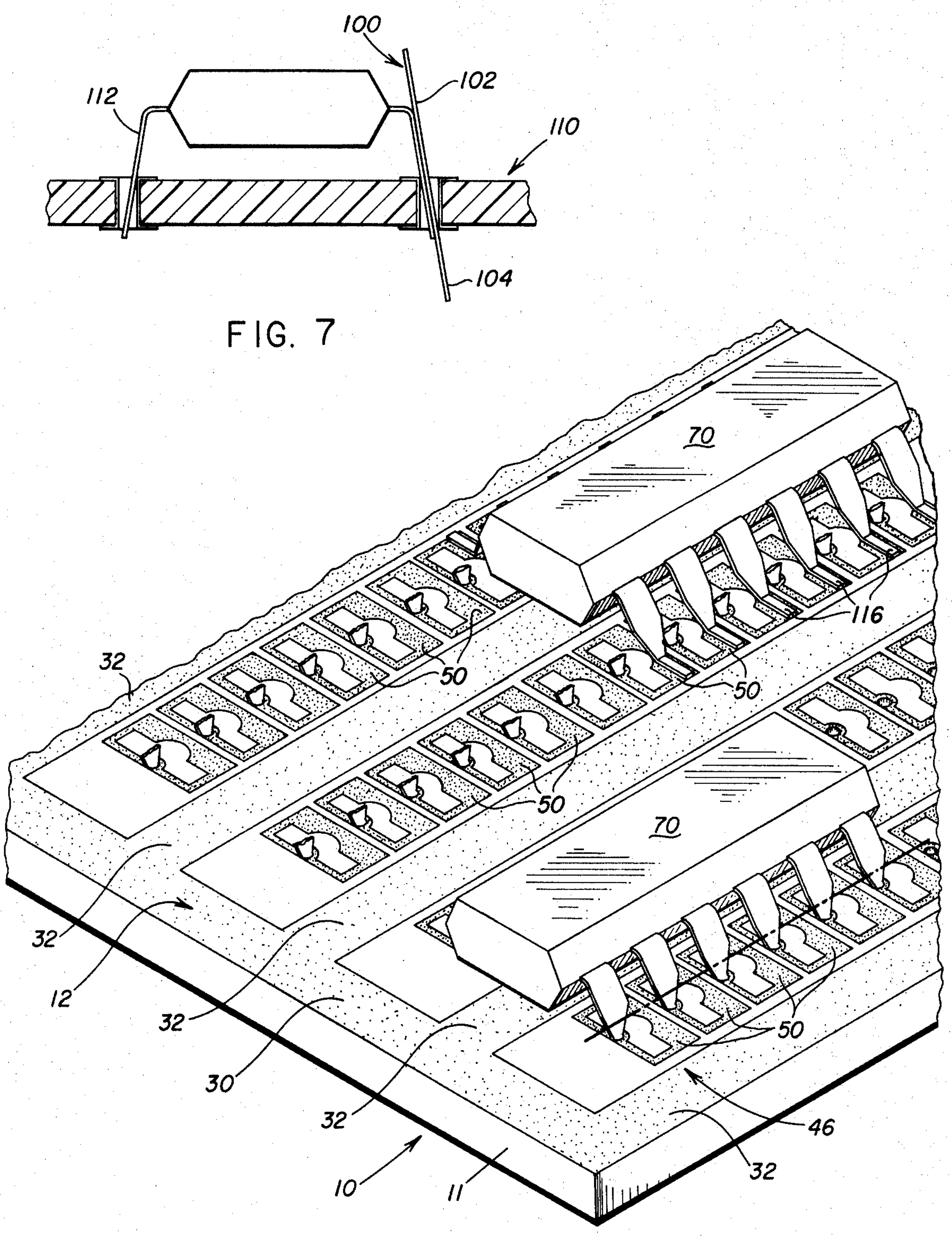

Another use of comb 100 is illustrated in FIG. 7. In some instances a board 110 may have such a thickness that pins 112 extending from a circuit element do not have sufficient length to be utilized in the wire stringing operation. In such case, pins 104 which are teeth of a comb 100, FIG. 6, are inserted through the same plated-through holes as pins 112. Pins 112 and pins 104 are then soldered in the holes following which spine 102 is removed. By this means pins 112 effectively are extended sufficient to enable wire stringing in the manner hereinbefore described.

As illustrated in FIG. 8, there may be instances where elements within a particular integrated circuit package may become defective. Such a package could be removed from board 10 by unsoldering pins 72 and then removing the entire package. However, such a procedure might result in damage to the solder connections between the wires on the reverse side 14 of board 10 and pads 42, in which case the circuit board 10 could be ruined.

In order to obviate this possibility, the present invention contemplates merely severing pins 72 from body 70 of any defective package, removing and discarding the same. Thereafter a new package having pins bent to form feet 116 identical to feet 106, FIG. 6, is utilized as a replacement for the discarded package. This is accomplished by soldering feet 116 to peninsula areas 50 of pads 46 on the obverse side 12 of board 10.

As has been indicated previously in conjunction with FIG. 6, the peninsula areas 50 are thermally isolated both from the plated-through holes 44 and from pads 42 on the reverse side 14. Therefore, soldering the replacement package to peninsula areas 50 will not result either in unsoldering the portions of pins 72 left from the original package, or in damage to the solder connections to wires on side 14 of board 10.

From the foregoing it will be understood that the present invention comprises a novel method of and apparatus for wiring electrical components which overcomes the difficulties that have long been associated with the prior art. High costs involved in providing art work for conventional printed circuit board and multilayer printed circuit board wiring techniques are completely eliminated. Likewise, the costs that are involved in effecting changes in circuitry wired by these techniques are completely eliminated. Rather, in accordance with the present invention a single printed circuit board may be utilized to form any desired wiring pattern by simply changing the programming of a computer or a numerical control wiring system. The use of the invention is also advantageous over wire wrapping techniques. Thus, the sockets that are necessary for use in wire wrapping systems are eliminated. Also, in accordance with the present invention it is not necessary to pre-strip insulated wires in order to carry out the wiring operation.

Other advantages are also obtained by use of the present invention. Thus, electrical components, particularly integrated circuit packages, may be mounted in a printed circuit board and wiring connections formed directly to pins thereof. Alternatively, pins can be mounted in the circuit board and wiring connections formed to such pins, whereupon pins of I.C. packages or other components may be soldered to the opposite side of the board without danger of unsoldering either the pins or soldered wire connections on the reverse side of the board. Similar techniques may be utilized to replace defective in-line packages or other components without danger of disrupting the wiring connections.

Although particular embodiments of the invention have been illustrated in the drawings and described in the foregoing detailed description, it will be understood that the invention is not limited to the embodiments disclosed, but is capable of numerous rearrangements, modifications, and substitutions of parts and elements without departing from the spirit of the invention.

What is claimed is:

1. A method of interconnecting electrical components on a circuit board comprising:

forming rows of solder pads on one face of said board, each coincident with one of a plurality of orthogonally arranged holes which extend through the board, mounting parallel guide strips between adjacent rows of said solder pads, said strips having upstanding fingers aligned with said holes in directions transverse of said strips, inserting conductive pins of electrical components through said holes from the face opposite said pads, stringing insulated wire around selected pins and around selected fingers of said guide strips such that said wires course in orthogonal as well as diagonal directions between said fingers and said pins, soldering the wire to a pad each location where the wire passes around one of said pins electrically to interconnect the components on the board, and severing said wire at each location where its course between a pad and finger is on a diagonal.

2. The method of wiring electrical components according to claim 1 wherein the step of forming rows of solder pads is further characterized by forming the solder pads on both sides of the board in an orthogonal pattern and wherein the guide strip mounting step is further characterized by mounting guide strips at spaced points along spaced lines extending in one direction of the orthogonal pattern.

3. A method of wiring electrical components including the steps of:

forming a component receiving structure comprising an orthogonal array of solder pads on one side of an insulative board, an aligned array of solder pads on the other side of the board, a plurality of holes each extending through the board from a solder pad on said one side to an aligned solder pad on said other side, and means extending through each hole for electrically connecting the solder pads on each side of the board, mounting strips of upstanding wire guide members on said one side of the board with the strips extending in a first direction of the orthogonal array of solder pads, each of said upstanding wire guide members on the strips comprising two opposed downwardly and inwardly tapered guide surfaces which face in second directions of the orthogonal array perpendicular to said first direction, inserting conductive pins extending from electrical components through the holes in the board from said other side to said one side thereof, passing insulated wire around selected pins and around selected wire guide members on said one side of the insulated board, and thereafter soldering the wire to the solder pads on said one side of the board and thereby electrically interconnecting the various electrical components on the board.

4. The method of wiring electrical components according to claim 3 further characterized by soldering the conductive pins extending from the electrical components in the holes extending through the insulated board.

5. The method of wiring electrical components according to claim 3 wherein the step of soldering the wire to the selected pins is further characterized by removing the insulation from the portions of the wire adjacent the selected pins and simultaneously soldering the wire to the solder pads.

6. The method of wiring electrical components according to claim 3 wherein the step of passing insulated wire around selected pins and around selected wire guide members is further characterized by passing insulated wire between adjacent strips of wire guide members and wherein the step of soldering the wire to the selected pins is further characterized by maintaining a predetermined spaced relationship between the portions of the wire extending between adjacent strips and the selected pin while the wire is soldered to the solder pads.

7. The method of wiring electrical components according to claim 3 wherein the step of passing insulated wire around selected pins and around selected wire guide member is further characterized by passing certain portions of the insulated wire between the pins and the wire guide member in accordance with the orthogonal array of solder pads on said one side of the insulated board and passing certain other portions of the insulated wire angularly relative to the orthogonal array, and further including the additional step of cutting all of the angularly extending portions of the insulated wire.

8. A method of wiring electrical components including the steps of:

forming a component receiving structure comprising an array of plated areas on one side of an insulative board, an aligned array of plated areas on the other side of the board, a plurality of plated-through holes each extending through the board from a conductive area on the one side to an aligned conductive area on the other side and thereby electrically connecting the conductive areas on the opposite sides of the board, and a plurality of conductive peninsula areas on the other side of the board each electrically connected to and thermally insulated from one of the plated areas on said other side, inserting a plurality of conductive pins which are at least structurally interconnected through the holes in the board from said other side to said one side, soldering each pin in its respective plated-through hole, passing insulated wire around selected pins from the plurality that are to be electrically connected, soldering the wire to the plated areas on said one side of the board corresponding to the selected pins, structurally disconnecting the pins from each other, and soldering conductive leads extending from an electrical component to selected conductive peninsula areas on the other side of the board.

9. The method of wiring electrical components according to claim 8 wherein the step of inserting conductive pins through the holes in the board is carried out by forming a comb of conductive material comprising a plurality of conductive pins and a spine interconnecting the pins, and wherein the step of structurally disconnecting pins is carried out by severing the spine of the comb from the pins.

10. A method of mounting electrical components of the type having conductive pins extending from a body portion on component receiving structures of the type comprising an array of conductive areas on one side of an insulative board, an array of aligned conductive areas on the other side of the board, a plurality of holes each extending through the board from a conductive area on said one side to an aligned conductive area on said other side, and means extending through each hole for electrically connecting the conductive areas on each side of the board, including the steps of:

forming a comb comprising a spine and conductive pins extending from the spine, inserting the conductive pins of the component to be mounted into selected holes in the board, inserting the pins of the comb into the same holes as the pins of the component in the board, soldering the pins of the component and the pins of the comb in the holes and thereby connecting the component and the pins of the comb to the board, and detaching the spine of the comb from the pins.

11. The method of mounting electrical components according to claim 10 including the additional steps of:

passing insulated wire around selected pins of the component and of the comb mounted in the board, and subsequently soldering the wire to the conductive areas on said one side of the board corresponding to the above pins and thereby forming electrical connections to the above selected pins of the electrical component.

12. The method of forming electrical connections according to claim 11 wherein:

the step of inserting the conductive pins of the electrical component into the holes in the board is carried out by inserting the pins into the holes from said other side of the board to said one side, the step of inserting the pins of the comb into the holes on the board is carried out by passing the pins of the comb through the board from said other side to said one side, and the step of passing insulated wire around the pins of the component and of the comb is carried out by passing insulated wire around the pins on said one side of the board.

13. The method of forming electrical connections according to claim 12 wherein the step of passing insulated wires around selected pins of the component and of the comb is further characterized by mounting upstanding wire guide members on said one side of the board and passing the insulated wire around said selected pins and around selected wire guide members, and wherein the step of soldering the wire to the conductive areas is further characterized by first removing the insulation from the portions of the wire adjacent the pins and thereafter soldering the wire to the conductive areas.

14. A system for interconnecting electrical components on a circuit board comprising:

a circuit board with rows of solder pads on one face of said board, each coincident with one of a plurality of orthogonally arranged holes which extend through the board, parallel guide strips mounted between adjacent rows of said solder pads, said strips having upstanding fingers aligned with said holes in directions transverse of said strips, electrical components having conductive pins extending through said holes from the face opposite said pads, insulated wire extending around selected pins and selected fingers of said guide strips such that said wires course in orthogonal as well as diagonal directions between said fingers and said pins, and solder connections between said wire to a pad each location where the wire passes around one of said pins electrically to interconnect the components on the board with a severed end on said wire at each location where its course from a pad and finger is on a diagonal.

* * * * *